United States Patent
Hashim et al.

(10) Patent No.: US 8,821,795 B2
(45) Date of Patent: Sep. 2, 2014

(54) COMBINATORIAL SCREENING METHOD AND APPARATUS

(75) Inventors: Imran Hashim, Saratoga, CA (US); Sandra Malhotra, San Jose, CA (US); Ryan Clarke, San Jose, CA (US); Sunil Shanker, Santa Clara, CA (US); Yun Wang, San Jose, CA (US); Yoram Schwarz, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 819 days.

(21) Appl. No.: 12/504,232

(22) Filed: Jul. 16, 2009

(65) Prior Publication Data

US 2010/0048419 A1 Feb. 25, 2010

Related U.S. Application Data

(60) Provisional application No. 61/091,249, filed on Aug. 22, 2008.

(51) Int. Cl.
*G01N 27/00* (2006.01)
*H01L 45/00* (2006.01)
*H01L 21/66* (2006.01)

(52) U.S. Cl.
CPC .............. *H01L 22/20* (2013.01); *H01L 45/126* (2013.01); *H01L 45/16* (2013.01); *H01L 45/144* (2013.01); *H01L 45/06* (2013.01); *H01L 45/1233* (2013.01); *H01L 22/14* (2013.01)
USPC .......................................... 422/82.02; 436/43

(58) Field of Classification Search
CPC ............................. G01N 27/30; G01R 31/3624
USPC .................. 436/43; 422/82.02, 82.01; 506/12
See application file for complete search history.

(56) References Cited

U.S. PATENT DOCUMENTS

2004/0001374 A1* 1/2004 Tanaka et al. ................. 365/200

* cited by examiner

*Primary Examiner* — Natalia Levkovich

(57) ABSTRACT

A combinatorial screening method and system are provided. The combinatorial system and method provide rapid data generation for characterization of phase change material. The characterization data is collected through a multipoint probe card where multiple regions are characterized in a single annealing cycle.

14 Claims, 10 Drawing Sheets

COMBINATORIAL SCREENING METHOD AND APPARATUS

FIELD OF THE INVENTION

The present invention relates generally to semiconductor processing. More specifically, a method of combinatorial screening and apparatus is described.

BACKGROUND

Combinatorial processing enables rapid evaluation of semiconductor processing operations. The systems supporting the combinatorial processing are flexible to accommodate the demands for running the different processes either in parallel, serial or some combination of the two.

Some exemplary semiconductor processing operations includes operations for adding (depositions) and removing layers (etch), defining features, preparing layers (e.g., cleans), doping, etc. Similar processing techniques apply to the manufacture of integrated circuit (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct research and development (R&D) on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate. Equipment for performing the combinatorial processing must support the efficiency offered through the combinatorial processing operations.

BRIEF DESCRIPTION OF THE DRAWINGS

The present invention will be readily understood by the following detailed description in conjunction with the accompanying drawings, and like reference numerals designate like structural elements.

FIGS. 11B and 11B-1 illustrate high level schematic diagrams of cross sectional views of exemplary test chips for the screening process in accordance with one embodiment of the invention.

DETAILED DESCRIPTION

Figure 1:
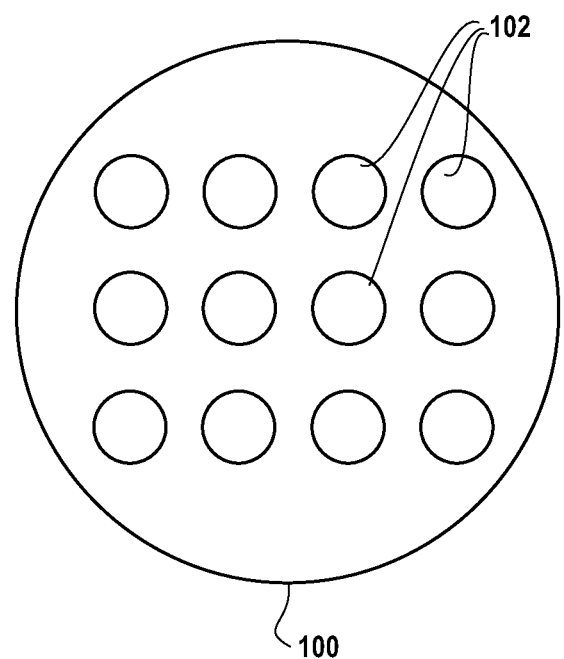
FIG. 1 is a simplified schematic diagram illustrating a substrate or coupon having multiple regions provided thereon.

The embodiments described herein provide for a high productivity combinatorial (HPC) method of accurately determining the phase transition temperature for phase change memory application materials. In one embodiment, chalcogenide alloys of different compositions are deposited on a substrate in a combinatorial fashion. These regions are then tested in parallel to determine a composition offering the optimal phase change characteristics for a memory application. In addition, the embodiments provide a high throughput screening method where the in-situ sheet resistance (Rs) measurements can be performed contemporaneously for multiple chalcogenide alloys deposited on a single substrate. It will be apparent, however, to one skilled in the art, that the present invention may be practiced without some or all of these specific details. In other instances, well known process operations have not been described in detail in order not to unnecessarily obscure the present invention.

Materials exist that can be electrically switched between generally amorphous and generally crystalline states for electronic memory applications. These materials are referred to as phase change memory (PCM) materials. Phase change memory materials can be used to form a type of non-volatile computer memory. One such PCM material is a chalcogenide. A typical chalcogenide material is a material that can be switched between two states, an amorphous state and a crystalline state, with the application of heat. In some chalcogenide materials, the materials may transition between more than two distinct states which could further increase storage capacity of phase change memory devices. Phase change memory is one of a number of new memory technologies that are attempting to compete in the non-volatile role with the almost universal Flash memory, which has a number of practical problems that PCM materials may address. Chalcogenide materials can include materials that partly include at least one or more of the following materials: Tellurium (Te), Selenium (Se), Antimony (Sb), Nickel (Ni), and Germanium (Ge), as well as various combinations thereof. In the amorphous state, the chalcogenide material has a relatively high resistance and in the crystalline state the chalcogenide material has a relatively low resistance. As the state of the chalcogenide material can only be changed by the application of energy, the chalcogenide material is non-volatile in that the material does not require energy to maintain its current state. Furthermore, because the resistance of the chalcogenide material varies with the state, the chalcogenide material can be reliably used to store binary data. Thus, the chalcogenide material is a viable candidate for a memory cell in a computer or other binary data storage usage. The challenge lies in identifying which chalcogenide materials may be viable candidates for phase change memory applications. High Productivity Combinatorial (HPC) screening processes may be used to evaluate variations of chalcogenide materials.

Figure 7:
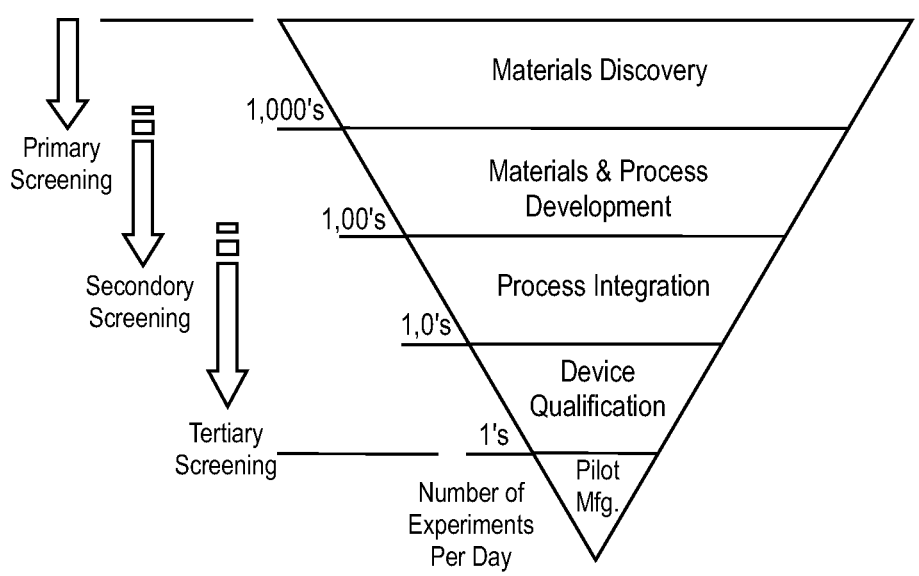
FIG. 7 is a simplified schematic diagram illustrating an overview of the High-Productivity Combinatorial (HPC) screening process for use in evaluating materials, unit processes, and process sequences for the manufacturing of semiconductor devices in accordance with one embodiment of the invention.

FIG. 7 is a simplified schematic diagram illustrating an overview of the High-Productivity Combinatorial (HPC) screening process for use in evaluating materials, unit processes, and process sequences for the manufacturing of semiconductor devices incorporating the identified chalcogenide materials. As illustrated in FIG. 7, primary screening incorporates and focuses on chalcogenide materials discovery. Here, the materials may be screened for certain properties in order to select a subset of possible candidates for a secondary level of screening, which will look at materials and unit processes development and process integration. Thereafter, tertiary screening further narrows these candidates through process integration and device qualification in order to identify possible optimizations in terms of materials, unit processes and process sequence integration.

The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

Figure 8:
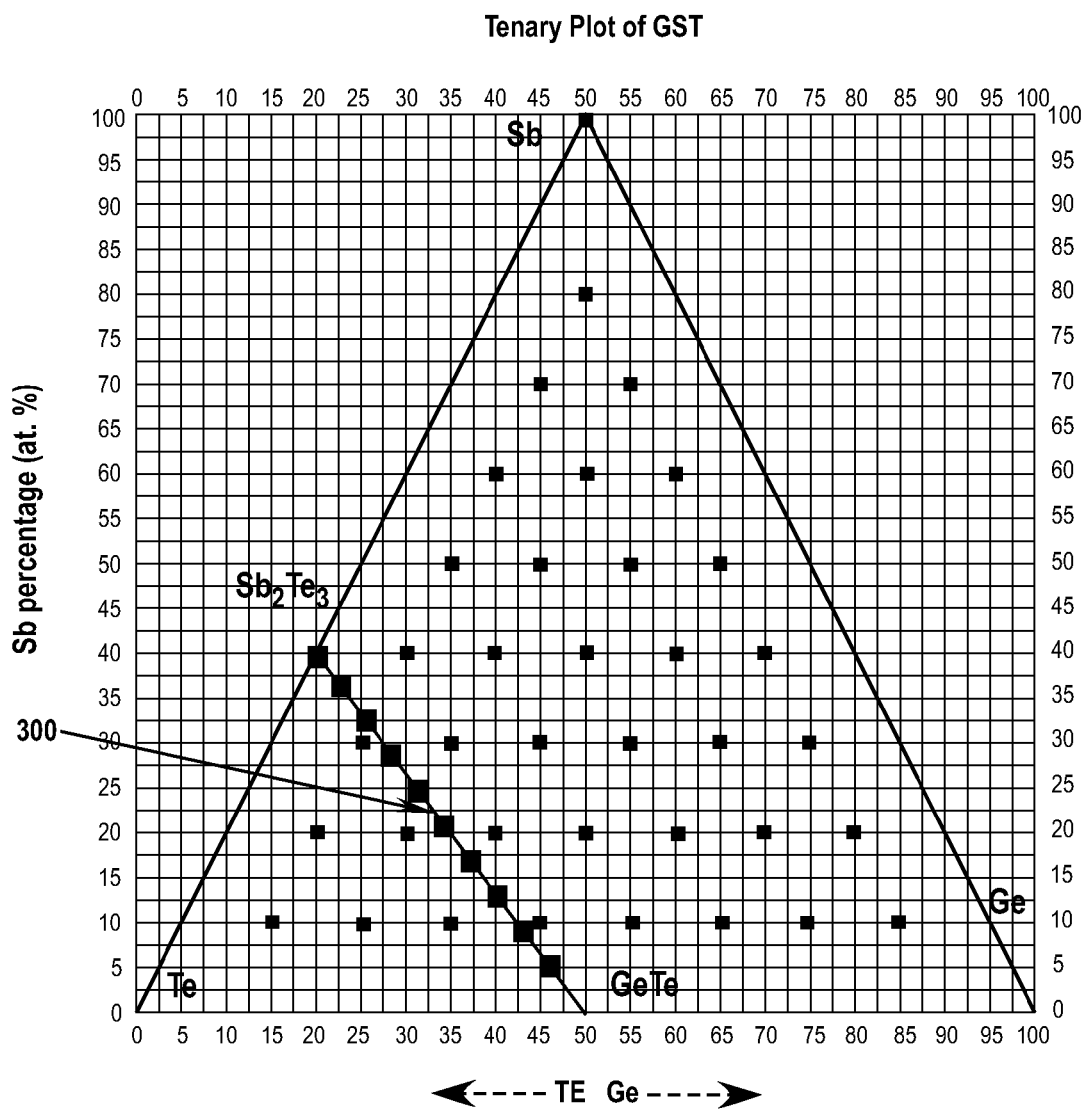
FIG. 8 represents a ternary plot of a chalcogenide material in accordance with one embodiment of the invention.
Figure 9:
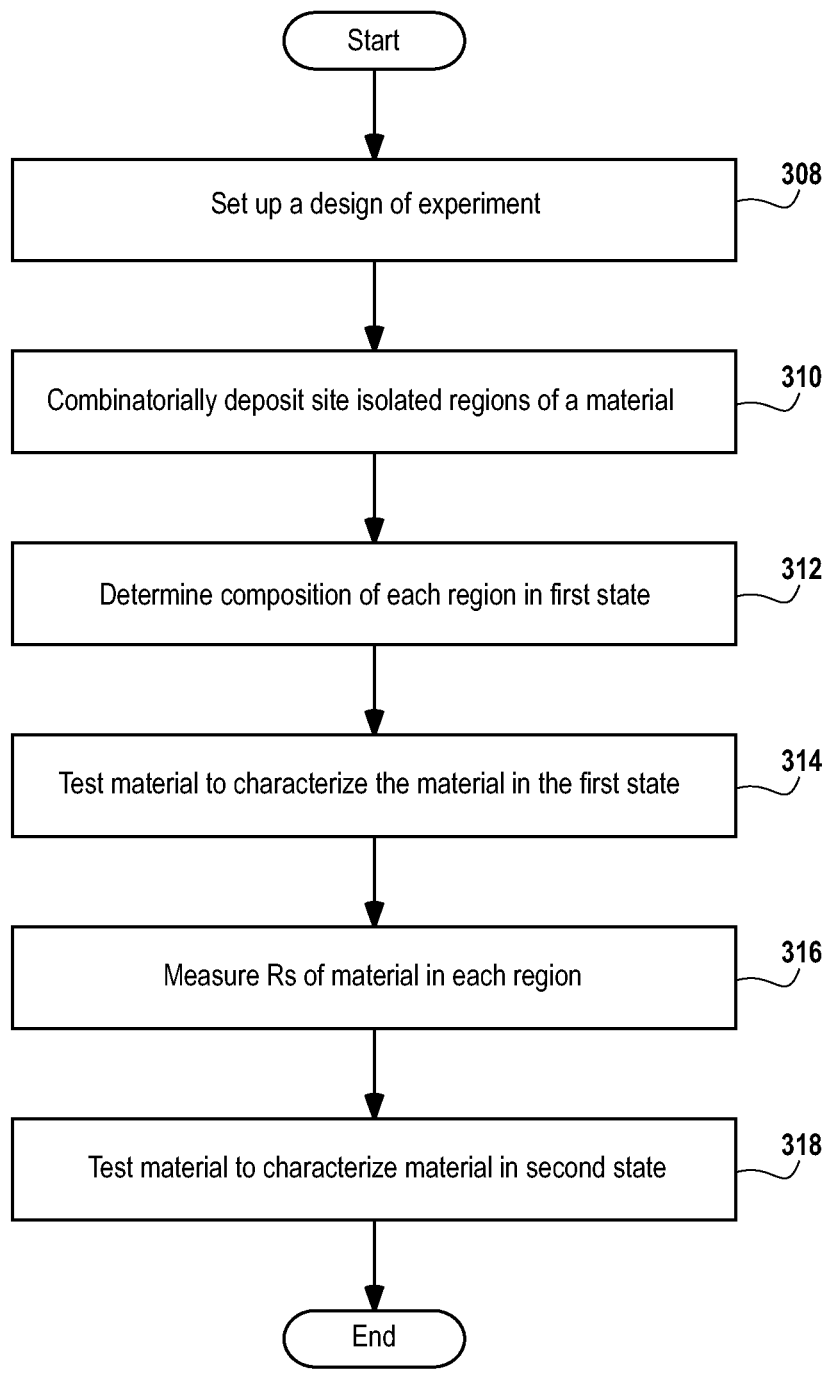
FIG. 9 is a flow chart diagram illustrating a work flow for the screening of a chalcogenide material in accordance with one embodiment of the invention.

FIG. 9 is a flow chart diagram illustrating a work flow for the screening of a chalcogenide material in accordance with one embodiment of the invention. In operation 308, a design of experiment is set up. In one embodiment, a ternary plot of a chalcogenide material provides information on various compositions for the design of experiment. FIG. 8 illustrates an exemplary ternary plot that may be utilized for the design of experiment. Tie line 300 which represents a line that crosses the ternary plot of FIG. 8 between two binary states of the chalcogenide material. In one embodiment, different compositions along tie line 300 may be utilized to develop the compositions for the site isolated regions illustrated on the substrate of FIG. 1. One skilled in the art will appreciate that while a single tie line is illustrated here, this is not meant to be limiting. That is, multiple tie lines may be used in order to derive compositions to be combinatorially deposited in a site isolated manner on a substrate for testing. The compositions deposited on a substrate, such as the substrate of FIG. 1, may come from a single tie line or multiple tie lines. Alternatively, the compositions may be randomly generated from a ternary plot.

Returning to FIG. 9, in operation 310, site isolated depositions of different compositions are provided onto a surface of a substrate. It should be appreciated that the High Productivity Combinatorial (HPC) deposition tools owned by the assignee may be utilized to deposit the material onto a substrate in a site isolated fashion. The composition for each site isolated region may be selected based on a ternary plot for a design of experiment in one embodiment. Depositing the material in a combinatorial manner may include varying one or more of unit processes, process sequences, and materials. For example, in addition to, or alternatively to, varying the composition of the chalcogenide deposited between the regions, the thickness of the layer of material may vary. Numerous other parameters may be varied under the combinatorial processing and the exemplary parameters discussed are not meant to be limiting. One skilled in the art will appreciate that within each region, the composition is deposited in a substantially uniform manner.

FIG. 1 is a simplified schematic diagram illustrating a substrate or coupon having multiple site-isolated regions provided thereon. Substrate 100 has a plurality of regions 102 deposited on a surface of substrate 100. In one embodiment, each of the regions 102 is different material combinations of a chalcogenide material or phase change material, the selection of which may be based on the ternary phase diagram of FIG. 8. One skilled in the art will appreciate that the compounds typically provided for chalcogenide materials may be manipulated so that different amounts/combinations of these materials are present in each of regions 102. For example, the chalcogenide material may be a "GST" compound as described in the ternary phase diagram of germanium (Ge), antimony (Sb), and tellurium (Te). The chalcogenide material deposited in each of the site-isolated regions may have different ratios of each of these elements, ranging from $Sb_2Te_3$ and GeTe shown along tie line 300 of FIG. 8. In one embodiment, the different compositions of materials deposited on substrate 100 are utilized for primary screening. In another embodiment, the materials are deposited in a combinatorial manner through a physical vapor deposition (PVD) tool, such as the High Productivity Combinatorial (HPC) systems of the assignee. One skilled in the art will appreciate that substrate 100 may be any suitable geometric shape and is not limited to the exemplary circular shape.

Figure 11A:
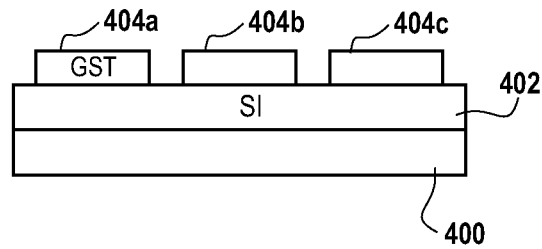
FIG. 11A illustrates a cross sectional view of the substrate illustrated in FIG. 1.

FIG. 11A illustrates a cross sectional view of the substrate illustrated in FIG. 1. In FIG. 11A, silicon substrate 400 includes a layer of silicon disposed thereover. Disposed over silicon dioxide layer 402 are various compositions of chalcogenide material 404a, b and c. It should be appreciated that the various compositions of material 404a-c are combinatorially deposited in a site isolated fashion as described above in one embodiment. The primary screening described herein characterizes the blanket wafer with the various site isolated regions deposited thereon. As mentioned above, the composition of the material for each of the site isolated regions may be related to a single tie line of a ternary plot, multiple tie lines, or randomly generated.

In operation 312 of FIG. 9, measurements are performed to determine the exact composition of each region deposited on the substrate. One skilled in the art will appreciate that a low energy x-ray emission spectroscopy (LEXES) may be utilized to characterize the composition of the various regions on the substrate. It should be appreciated that alternative methodologies besides the LEXES methodology may be used to characterize the site isolated region compositions. For example, x-ray fluorescence (XRF) is another analysis tool capable of being utilized to characterize the composition of the various regions of the substrate. From operation 312, the method advances to operation 314 where testing is performed on the site isolated regions to characterize the material in the initial state being deposited. As the chalcogenide material changes from an amorphous state to a crystalline state, the material is characterized in both states. Thus, through variable angle spectroscopic ellipsometer (VASE) techniques, or other known techniques, the reflectivity, thickness, density, etc., may be captured in the amorphous state. As the chalcogenide is typically in an amorphous state after the deposition, the amorphous state may be tested first out of convenience.

The deposited materials in each of the regions may then be screened to determine potential PCM candidates for memory applications. Proceeding to operation 316 of FIG. 9, the sheet resistance ($R_s$) is measured. A key metric for phase change memory alloys, such as chalcogenide materials, is the amorphous to crystalline transition temperature, as this is directly related to the switching speed for the memory cell. One technique to determine this transition temperature is to deposit the alloy, anneal each alloy separately at different temperatures, and then measure the sheet resistance (Rs) for each separate alloy. When the material is in the amorphous state, the Rs will be high; and when the material is in the crystalline state, the Rs will be low. It should be appreciated that the incremental increase in the annealing temperature must be small enough so as not to lose the transition. Thus, in one embodiment, a temperature resolution of approximately two degrees C. is adequate for the embodiments described herein to capture the transition. In one embodiment, the $R_s$ is measured for multiple isolated regions contemporaneously through the embodiments discussed below. It should be appreciated that for the multiple alloy compositions present on the same substrate, each of the different alloy compositions are subjected to the same thermal treatment when the entire substrate is heated on a chuck. Multiple regions are measured in parallel to rapidly characterize the amorphous to crystalline transformation as captured during the temperature ramp, as opposed to capturing data for a single composition for each temperature ramp. The embodiments described below provide a multi-point probe that measures multiple regions 102 while substrate 100 is being heated to characterize the potential PCM materials. The parallel data gathering enabled through the systems described below leads to rapid data generation and significantly reduces the amount of annealing required as compared to a single point probe.

The embodiments provided herein utilize a multiple region probe card having multiple probe sites for measuring the Rs. The four point contacts of each of the multiple probe sites make contact with each area of interest, or region, on the substrate and remain stationary as the temperature of the stage is ramped from a first temperature to a second temperature. In one embodiment, the temperature ramp is from room temperature to about 300 degrees C.

As described further below, a voltage source applies a voltage to each of the multiple probe sites. The current for each of the multiple probe sites is measured through the four point contact in a sequential manner as the temperature is ramped. In one embodiment, the electrical measurement takes approximately two seconds per contact, thereby providing the ability to scan multiple times for each two degrees C. increase in temperature. This provides sufficient resolution to capture the amorphous to crystalline phase transition for the multiple compositions on the substrate being measured. It should be appreciated that the device described herein is able to measure the current for amorphous materials with a relatively high Rs, e.g., as high as Mega-Ohm/square, and crystalline phases with a sheet resistance as low as hundreds of Ohm/square. In addition, the measurement chamber in which the processing is performed is capable of creating a sealed mini-environment from an external environment. In one embodiment, the chamber is able to be purged and exhausted so as to maintain an inert environment that prevents or inhibits any oxidation. In another embodiment, the multi-point probe card is capable of translating in the X, Y, and/or Z directions in order to accommodate the multiple regions on the substrate.

Figure 2:
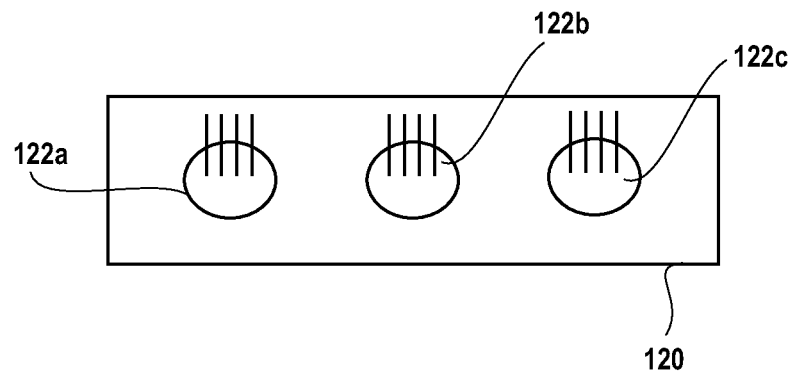
FIG. 2 is a simplified schematic diagram illustrating a top view of a multipoint probe card in accordance with one embodiment of the invention.

FIG. 2 is a simplified schematic diagram illustrating a top view of a multipoint probe card in accordance with one embodiment of the invention. Multipoint probe card 120 includes multi-point probes 122a through 122c. The multi-point probes are provided for measuring sheet resistance (Rs) of each of the regions of the substrate of FIG. 1. It should be appreciated that the embodiments described herein are not limited to a probe card covering three regions, as the multi-point probe card of FIG. 2 is one exemplary illustration. That is, the multi-point probe card may be configured to contemporaneously monitor any number of regions greater than a single probe for characterizing the phase change of the combinatorial array in accordance with one embodiment of the invention. In another embodiment, each region being probed is monitored with a four point probe. It should be appreciated that the tip composition and shape is exemplary. That is, any suitable composition and shape that have sufficient strength and flexibility to withstand the temperature change and accommodate the expansion and contraction of the substrate as the substrate is heated and cooled, respectively, may be incorporated.

Figure 3:
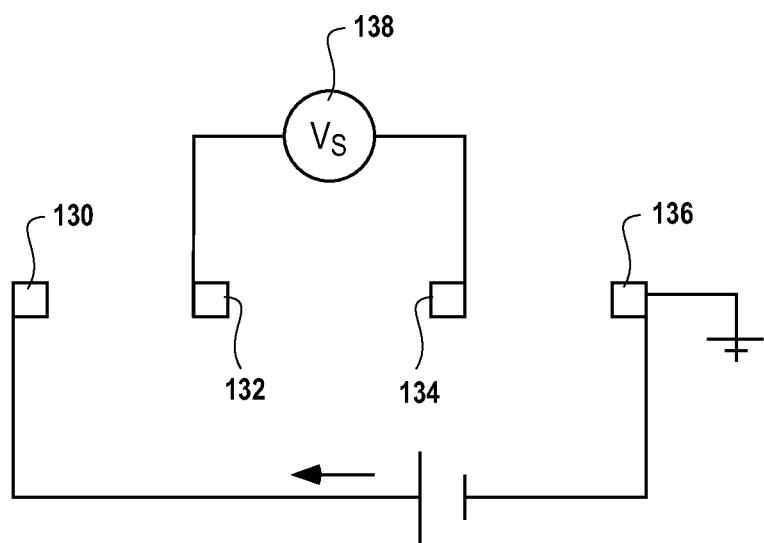
FIG. 3 is simplified schematic diagram illustrating further details of the four point probe of FIG. 2 in accordance with one embodiment of the invention.

FIG. 3 is simplified schematic illustrating further details of the four point probe in accordance with one embodiment of the invention. The four point probe includes probes 130-136. Voltage source 138 is configured to measure a voltage between probes 132 and 134. The source current is measured between probes 130 and 136. Probe card 120 of FIG. 2 may utilize a ceramic based material suitable to withstand the heat applied to the substrate in one embodiment. One skilled in the art will appreciate that the wiring for each of the probes can be disposed on a surface of the ceramic base and the ceramic base can be encapsulated with an insulative material or glass epoxy material compatible with the processing parameters described herein. The probe card 120 can then "plug in" to a receptacle on a computing device so that the signals captured from the probes can be processed to characterize the phase change in each region of the substrate. In one embodiment, probe card 120 is supported on a robot having X, Y, and/or Z motion capability.

Figure 4:
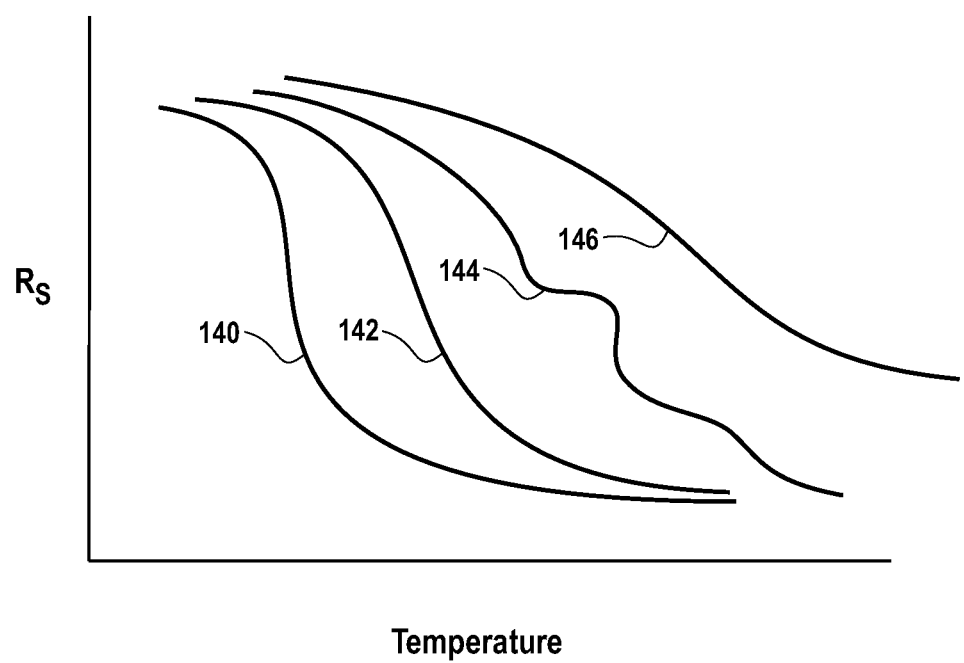
FIG. 4 is a simplified schematic diagram illustrating a graph of the data derived through the embodiments described herein.

FIG. 4 is a simplified schematic diagram illustrating a graph of the data derived through the embodiments described herein. From the captured data, the sheet resistance (Rs) is calculated. This data will then yield a curve, as illustrated in FIG. 4, showing the relationship between the Rs and the temperature for multiple regions of varying material composition from a single annealing sequence. From this curve, the transition temperature is derived where the phase change material transitions between an amorphous and crystalline state. In addition, the rate of the transition, i.e., the time for the transition to occur, may be deduced from the curve. Thus, with regard to phase change material for a memory, e.g., chalcogenide, the temperature and the rate of switching between states may be compared for the combinatorial array. The embodiments described above enable the rapid collection of data, as multiple regions are characterized during the temperature change. As compared to a single region being characterized for each temperature change, the embodiments significantly reduce the time and effort required to characterize the combinatorial array. In FIG. 4, multiple curves are illustrated which may be generated through a multipoint probe card. That is, curves 140, 142, 144 and 146 may be generated by a four-point probe card displaced over a substrate while the deposited chalcogenide materials are heated. While curves 140, 142, 144, and 146 illustrate a single transition, some chalcogenide materials may illustrate multiple transitions, thereby providing expanded applicability to memory application. Thus, through the probe card described herein, four regions can be contemporaneously monitored to generate the four curves of FIG. 4 in one annealing cycle.

As illustrated in FIG. 4, the sheet resistance (Rs) is plotted versus the temperature. In one embodiment, the material is in the amorphous state as deposited. In the amorphous state, the material has a higher resistance. As the temperature increases, the phase change occurs for the different compositions associated with each of curves 140 through 146. This transition is captured for each of the curves, thus indicating the switching speed and the temperature level at which the phase change occurs. Thus, multiple combinations of the chalcogenide material may be evaluated in an efficient manner through the embodiments described herein. That is, data is rapidly generated from a single annealing cycle. In addition, the current may change over a range of six magnitudes of order during the phase change. Accordingly, the probe card of FIG. 2 is configured to sense the current over this wide range.

Figure 5:
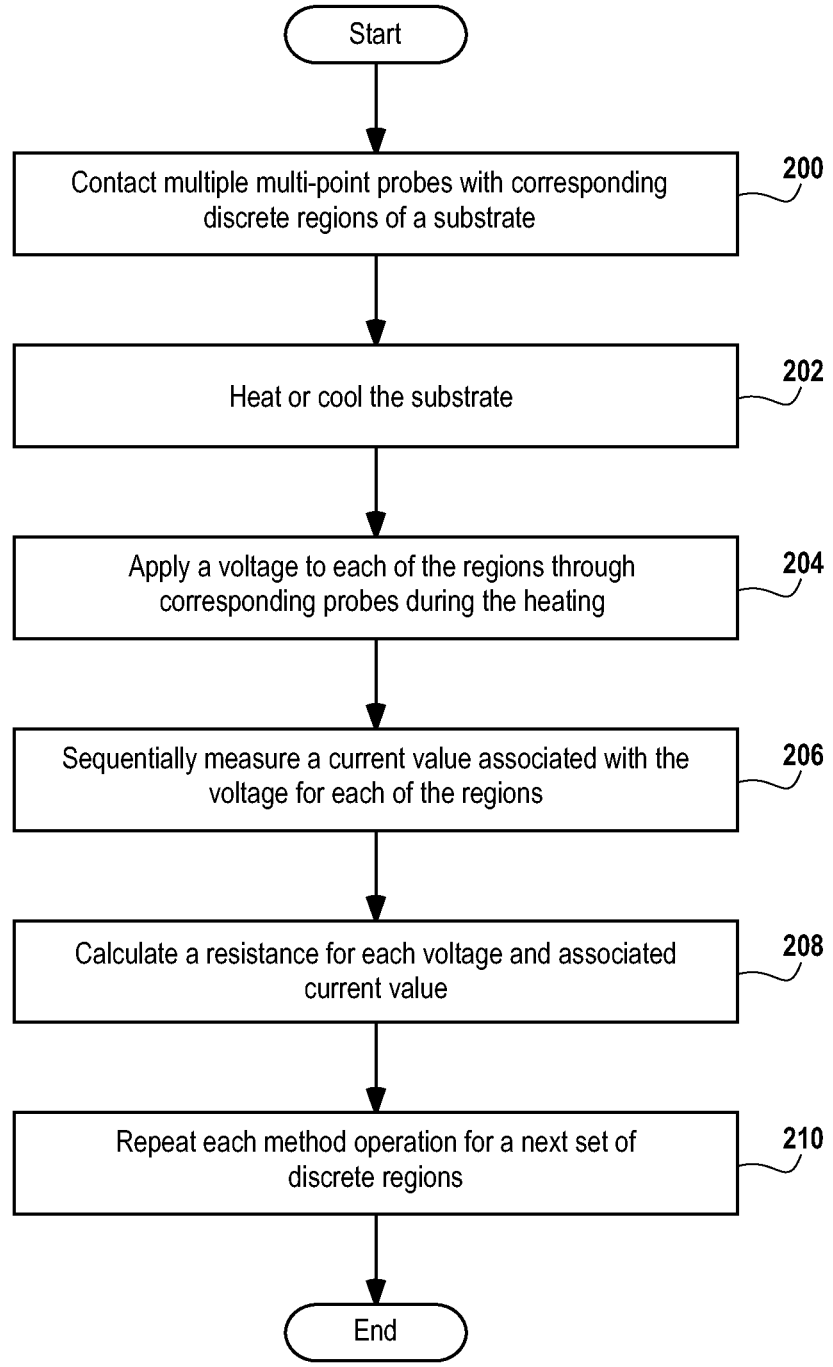
FIG. 5 is a flow chart diagram illustrating the method operations for combinatorially evaluating a phase change material in accordance with one embodiment of the invention.

FIG. 5 is a flow chart diagram illustrating the method operations for combinatorially evaluating a phase change material. The method initiates with operation 200 where multiple multi-point probes contact discrete regions of a substrate. For example, the probe card of FIG. 2 may be placed over a plurality of regions of the substrate of FIG. 1. The method advances to operation 202 where the substrate temperature is changed, i.e., the substrate is heated or cooled. As mentioned above, the substrate may be placed onto a chuck or support plate having heating capabilities.

In one embodiment, a voltage sweep is performed across each region in order to define a minimum current for the corresponding region. The voltage sweep provides information as to the minimum current able to be measured through the multi-point probe of each region in accordance with one embodiment of the invention. As mentioned above, the probe card must accommodate a wide current range since each of the regions can have a different and unknown resistance transition point. Thus, the voltage sweep determines whether the current is detectable over any noise for the applied voltage for each region. If the current is not detectable, then the voltage is increased until a detectable current level is achieved. It should be appreciated that the minimum detectable current value and the voltage range for the voltage sweep may be user defined in one embodiment. In another embodiment, the increase of the voltage is adaptable, i.e., the voltage increase may be greater for larger differences between the actual detected current and the minimum detectable current. Likewise, the voltage increase may be less for smaller differences between the actual detected current and the minimum detectable current. It should be appreciated that the voltage sweep may be performed prior to each measurement in one embodiment. In this embodiment, the substrate temperature may increase or decrease and the voltage sweep ensures that a minimum current is detectable. Alternatively, the voltage sweep may be performed initially in the embodiment where the resistance will decrease, e.g., where the temperature increases. Thereafter, the voltage sweep is unnecessary as the transition causes the resistance to drop and the current will increase.

Contemporaneous with heating or cooling of the substrate, method operation 204 is executed. In operation 204 a voltage is applied to each of the regions through corresponding probes of the probe card. As mentioned with reference to FIG. 4, a portion of the probes may supply the voltage. The method then proceeds to operation 206 where a current value associated with the voltage is sequentially measured for each probe region. This current value is captured and can be saved in order to calculate the sheet resistance as specified in operation 208. In one embodiment, the current value is measured approximately every 2 seconds for each region to ensure capturing the phase transition. The algorithm will cycle through operations 202 to 208 over a temperature range in order to capture the data to generate the graph illustrated in FIG. 4. In one embodiment, the temperature range is between about 25° C. and 300° C. Once the data is captured for the temperature range, the probe card is moved to a next set of regions on the substrate as specified in operation 210 and the method operations are repeated as described above.

Figure 6:
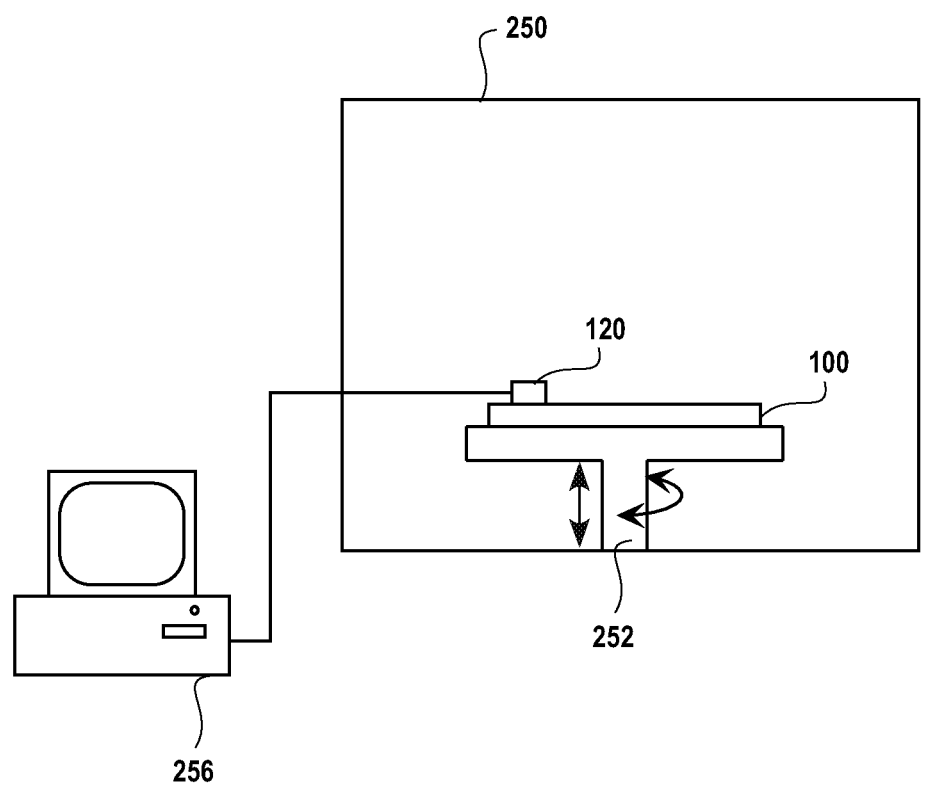
FIG. 6 is a simplified schematic diagram illustrating the system capable of capturing the data described herein in accordance with one embodiment of the invention.

FIG. 6 is a simplified schematic diagram illustrating the system capable of capturing the data described herein in accordance with one embodiment of the invention. In FIG. 6, tool 250 includes heated chuck 252 on top of which substrate 100 is disposed. Heated chuck 252 is configured to provide rotation and/or vertical translation in one embodiment. Multipoint probe card 120 is disposed over a portion of substrate 100 in order to measure the sheet resistance as described herein. In one embodiment, multi-point probe card 120 is attached to a robot to provide X, Y, and/or Z movement. The data from multipoint probe 120 is collected by computing device 256. Computing device 256 generates data and sheet resistance versus temperature curves as described above. Computing device 256 may also control and execute the algorithm described herein to sequentially force voltage over the different multipoint probes contemporaneous with the heating. The current values are then sequentially captured for the different multi-point probes over a temperature range. It should be appreciated that tool 250 is capable of being isolated from an external environment. Thus, the environment within tool 250 is controlled so as to prevent oxidation of the phase change material being tested and to provide for the controlled exhaust of the gases maintaining the controlled environment.

As a result of the sheet resistance monitoring, the characterization of the different regions for a transition temperature can be captured in order to evaluate which compositions provide the desired characteristics for a memory device in one embodiment. Upon completion of the Rs testing, the material of each of the regions is transformed from an amorphous state to a crystalline state. After capturing the sheet resistance and the transition temperature, the PCM materials in their crystalline state are then tested through the VASE technique, or another known suitable technique, for reflectivity, density, crystalline state, etc, in operation 318. These data collected from the site isolated regions may be considered in the selection of a subset of the materials to be used in the secondary stage of the combinatorial process.

It should be noted that the testing described herein, e.g., the testing mentioned with reference to operations 312, 314, 316, and 318, is exemplary and not meant to be limiting. That is, other known testing mechanisms providing characteristics of the deposited material can be performed. In one embodiment, data concerning the density change from the amorphous state to the crystalline state, and vice versa, may be captured. It may be desirable for the density change to be within specified limits so that delamination does not occur when a particular composition of chalcogenide is utilized as a memory element.

Figure 10:
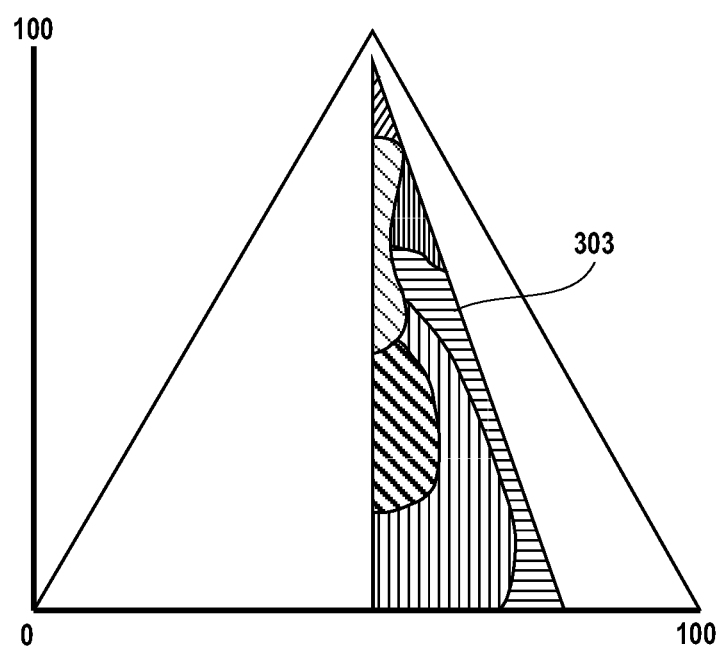
FIG. 10 is a simplified schematic diagram illustrating a contour plot generated through the primary screening evaluation described above.

FIG. 10 is a simplified schematic diagram illustrating a contour plot generated through the primary screening evaluation described above. From the data collected through performing electrical tests on the single wafer with the site isolated regions, various data presentations are possible. In one embodiment, a contour plot which illustrates section 303 of the ternary diagram is utilized. The contour plot illustrates composition sections in a manner where compositions sharing common characteristics are readily apparent. For example, in FIG. 10, the various cross hatched regions represent compositions with common crystallization temperatures in one embodiment. It should be appreciated that numerous other parameters may be characterized for the substrates, such as the slope of the transition, the density change of the material, reflectivity changes, etc. Thus, the contour plots provide a visual aid as to the distribution of a certain parameter within a portion of the ternary plot. Thereafter, a user may select a subset of compositions from the contour plot for further testing as described below, in secondary or tertiary stages of the combinatorial process.

A subset of PCM materials is selected based on the data collected during the primary screening of the combinatorial process. In one embodiment, the subset may be selected based on which materials have the steepest slope in an Rs. v. temperature plot, such as those described above. The subset having a slope falling within a particular range indicative of a clean and fast transition between an amorphous phase and a crystalline phase may be selected because such a transition may be desired in a memory device. In another embodiment, the subset may be selected based on which materials have more than one transition during the phase change from amorphous to crystalline. These materials may be selected if development of memory devices based on this phenomena are desired.

Once the subset of PCM materials is selected based on the data collected in the primary screening stage, the materials may be further tested in a secondary stage of combinatorial processing. The secondary stage of combinatorial processing may involve the use of a test chip to test the subset of PCM materials. The test chip enables the efficient development of materials, processes, and process sequence integration schemes for semiconductor manufacturing processes in either the secondary, tertiary, or both the secondary and tertiary stages of combinatorial processing. In general, the test chip simplifies the processing of devices or partially formed devices such that the devices can be tested immediately after formation. The immediate testing allows for the high throughput testing of varied materials, processes, or process sequences on the test chip. The test chip has multiple site isolated regions where each of the regions can be varied from one another. Additionally, the structures in each of the site isolated regions may be preformed so that a minimum number of steps are required in forming a device or partially formed device within each of the regions of the test chip.

Figure 11B:
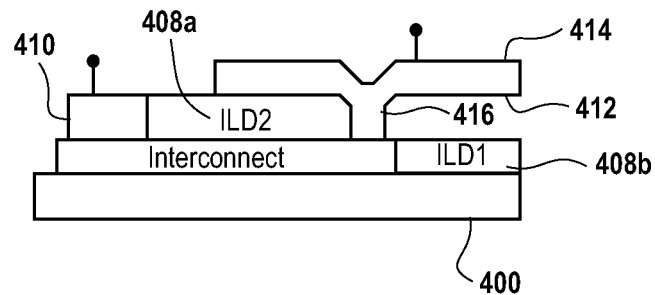
Figures 1, 11B:
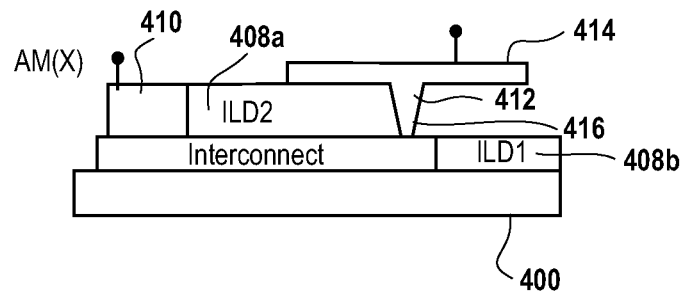

FIGS. 11B and 11B-1 illustrate high level schematic diagrams of cross sectional views of the substrate for different levels of the screening process in accordance with one embodiment of the invention. FIG. 11B illustrates a substrate, such as the test chip described above, onto which actual devices are manufactured which utilize the compositions identified through the primary screening. In FIG. 11B, silicon substrate 400 is provided with interconnect or metallization lines 406 disposed over silicon substrate 400. Interlayer dielectric layers 408a and 408b are provided to insulate the various interconnect lines 406. Pad 410 is provided for access to the bottom electrode of the device of FIG. 11B. Chalcogenide material is deposited in layer 412. The deposition technique used may be, for example, physical vapor deposition (PVD). Heater 416 is provided underneath a portion of chalcogenide layer 412. By applying a current to heater 416 the phase of chalcogenide material in the region above heater 416 will transition as described above. Thus, through a connection to top electrode 414 and pad 410 further electrical testing on the chalcogenide material can be performed immediately after forming the device incorporating the chalcogenide material. One skilled in the art will appreciate that the testing of an actual device manufactured with the desired composition enables further characterization testing. For example, set/reset time and set current/reset current may be characterized for the particular device and composition in FIG. 11B.

FIG. 11B-1 illustrates an alternative device structure which can be deposited through alternative deposition methods in accordance with one embodiment of the invention. In FIG. 11B-1, chemical vapor deposition or atomic layer deposition may be utilized to deposit the chalcogenide material. It should be appreciated that as feature sizes continue to shrink, chemical vapor deposition and atomic layer deposition may be more desirable for their conformal aspects with the small feature sizes. Irrespective of the deposition technique, the device, and the corresponding material composition can be further characterized. The test chips of FIGS. 11B and 11B-1 may be utilized for secondary or tertiary screening in one embodiment. In another embodiment, the tertiary/quaternary screening can include pulling an actual production wafer from a conventional process. Here, the wafer can be manufactured up to where the chalcogenide material is deposited. The wafer can then be combinatorially processed so that the desirable chalcogenide compositions derived from previous screening operations are deposited. The wafer is then returned for conventional processing and the chips resulting therefrom can be further evaluated. The resulting films or layers deposited can then be evaluated through the embodiments described herein for specific properties to provide information on the optimal process parameters, materials, unit processes or process sequences.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for screening material, comprising:
contacting a set of probes extending from a moveable probe card with a discrete region of a top surface of a substrate, wherein the moveable probe card is coupled to a voltage source to provide access of the voltage source to the set of probes;

heating a bottom surface of the substrate through a support over which the substrate is disposed;

applying a voltage from the voltage source to the discrete region through the set of probes during the heating, wherein the heating is independent of the applying a voltage;

measuring through the moveable probe card, a current value associated with the applied voltage;

measuring a temperature of the discrete region during the current measuring;

calculating a resistance for the applied voltage and the measured associated current value;

changing the applied voltage and the temperature;

repeating the current measuring, the temperature measuring and the calculating for the changed applied voltage and the changed temperature;

repeating each method operation for a next discrete region, the next discrete region having a varied material composition relative to a material composition of the discrete region.

2. The method of claim 1, wherein the material composition of the discrete region and the next discrete region comprises a phase change material.

3. The method of claim 1, wherein a material composition of each of the discrete regions is locally uniform within the discrete regions.

4. The method of claim 1, further comprising:
combinatorially depositing each of the discrete regions on a surface of the substrate.

5. The method of claim 4, wherein the combinatorially depositing includes varying material compositions between the discrete regions.

6. The method of claim 1, wherein screening of the discrete region and the next discrete region occur contemporaneously.

7. A method for performing combinatorial processing on a substrate comprising:

providing a substrate, wherein the substrate comprises a plurality of discrete regions on a top surface of the substrate, wherein the plurality of discrete regions each have a material composition that is varied in a combinatorial manner among the discrete regions;

contacting a set of probes extending from a moveable probe card with a discrete region of a top surface of a substrate, wherein the moveable probe card is coupled to a voltage source to provide access of the voltage source to the set of probes;

heating a support over which the substrate is disposed;

applying a voltage from the voltage source to the discrete region through the set of probes during the heating, wherein the applying a voltage is independent of the heating;

measuring through the moveable probe card, a current value associated with the applied voltage;

measuring a temperature of the discrete region during the current measuring;

calculating a resistance for the applied voltage and the measured associated current value;

changing the applied voltage and the temperature;

repeating the current measuring, the temperature measuring and the calculating for the changed applied voltage and the changed temperature;

repeating each method operation for a next discrete region.

8. The method of claim 7, wherein the material composition of the plurality of discrete regions comprises a phase change material.

9. The method of claim 7, wherein a material composition of each of the plurality of discrete regions is locally uniform.

10. The method of claim 7, wherein creating a plurality of discrete regions on the substrate in a combinatorial manner comprises combinatorially depositing each of the discrete regions on a surface of the substrate.

11. A method for performing combinatorial processing on a substrate comprising:

providing a substrate, wherein the substrate comprises a plurality of discrete regions on a top surface of the substrate, wherein the plurality of discrete regions each have a material composition that is varied in a combinatorial manner among the discrete regions;

contacting a set of probes extending from a moveable probe card with multiple discrete regions of a top surface of a substrate, wherein the moveable probe card is coupled to a voltage source to provide access of the voltage source to the set of probes;

heating a support over which the substrate is disposed;

applying a voltage from the voltage source to the multiple discrete regions through the set of probes during the heating, wherein the applying a voltage is independent of the heating;

measuring through the moveable probe card, a current value associated with the applied voltage;

measuring a temperature of the multiple discrete regions during the current measuring;

calculating a resistance for the applied voltage and the measured associated current value;

changing the applied voltage and the temperature;

repeating the current measuring, the temperature measuring and the calculating for the changed applied voltage and the changed temperature.

12. The method of claim 11, wherein the material composition of the plurality of discrete regions comprises a phase change material.

13. The method of claim 11, wherein a material composition of each of the plurality of discrete regions is locally uniform.

14. The method of claim 11, wherein creating a plurality of discrete regions on the substrate in a combinatorial manner comprises combinatorially depositing each of the discrete regions on a surface of the substrate.

* * * * *